United States Patent [19]
Ceglio et al.

[11] Patent Number: 5,691,541
[45] Date of Patent: Nov. 25, 1997

[54] MASKLESS, RETICLE-FREE, LITHOGRAPHY

[75] Inventors: Natale M. Ceglio, Livermore; David A. Markle, Saratoga, both of Calif.

[73] Assignees: The Regents of the University of California, Oakland; Ultratech Stepper, Inc., San Jose, both of Calif.

[21] Appl. No.: 645,531

[22] Filed: May 14, 1996

[51] Int. Cl.⁶ ................................................ G21K 5/00
[52] U.S. Cl. .............................. 250/492.1; 378/34
[58] Field of Search ..................... 250/492.1, 492.2, 250/492.3; 378/34

[56] References Cited

U.S. PATENT DOCUMENTS

| | | | |
|---|---|---|---|
| 4,793,699 | 12/1988 | Tokuhara | 350/487 |
| 4,924,257 | 5/1990 | Jain | 250/492.2 |
| 5,247,180 | 9/1993 | Mitcham et al. | 250/492.1 |
| 5,363,021 | 11/1994 | MacDonald | 313/366 |
| 5,439,781 | 8/1995 | MacDowell et al. | 250/492.1 |
| 5,512,759 | 4/1996 | Sweatt | 250/492.1 |

OTHER PUBLICATIONS

Andrew M. Hawryluk and Natale M. Ceglio, "Wavelength Considerations in Soft-X-Ray Projection Lithography", Applied Optics, vol. 32, No. 34, Dec. 1, 1993, pp. 7062–7067.

Michael A. Mignardi, "Digital Micromirror Array for Projection TV", Solid State Technology, Jul. 1994, pp. 63–68.

Brian Dance, "French Conference Presents Ultrafine Fabrication Advances", Semiconductor International, Feb. 1996, p. 62.

R. Seltmann et al., "New System for Fast Submicron Optical Direct Writing", Microelectronic Engineering 30 (1996) pp. 123–127.

Primary Examiner—Bruce Anderson
Attorney, Agent, or Firm—Henry P. Sartorio

[57] ABSTRACT

A lithography system in which the mask or reticle, which usually carries the pattern to be printed onto a substrate, is replaced by a programmable array of binary (i.e. on/off) light valves or switches which can be programmed to replicate a portion of the pattern each time an illuminating light source is flashed. The pattern of light produced by the programmable array is imaged onto a lithographic substrate which is mounted on a scanning stage as is common in optical lithography. The stage motion and the pattern of light displayed by the programmable array are precisely synchronized with the flashing illumination system so that each flash accurately positions the image of the pattern on the substrate. This is achieved by advancing the pattern held in the programmable array by an amount which corresponds to the travel of the substrate stage each time the light source flashes. In this manner the image is built up of multiple flashes and an isolated defect in the array will only have a small effect on the printed pattern. The method includes projection lithographies using radiation other than optical or ultraviolet light. The programmable array of binary switches would be used to control extreme ultraviolet (EUV), x-ray, or electron, illumination systems, obviating the need for stable, defect free masks for projection EUV, x-ray, or electron, lithographies.

20 Claims, 6 Drawing Sheets

MASKLESS, RETICLE-FREE, LITHOGRAPHY

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The invention relates to the field of projection lithography in which a pattern is printed onto a substrate such as a wafer, a flat panel or a circuit board.

2. Description of the Prior Art

The lithographic production of integrated circuits, flat panel displays, magnetic head structures and other micro-mechanical devices generally involves the use of optical steppers to image a master pattern contained on a mask or reticle through a lens onto a wafer or glass substrate using visible or ultraviolet light. The field size of the imaging lens is generally much smaller than the full area to be patterned on the substrate, so either multiple exposures are made using a step-and-repeat motion of the stage in the image plane, or the reticle and image plane stage are scanned in synchronism to expose an area which is bigger than that covered by the lens. The former system is often called a step-and-repeat system, and the latter a scanner or a step-and-scan system.

In both classes of lithography system the mask or reticle is an expensive element which takes time to write, inspect, repair and protect. Any time a modification of the reticle pattern is required, no matter how trivial the change, a new reticle must be prepared which takes time and costs money. Changing the reticle is generally a slow process, so if multiple reticles are required to expose the same substrate or if only a few substrates are required for each reticle pattern, then the throughput of the lithography system suffers substantially.

The terms mask and reticle are used interchangeably herein. Both represent the carrier for the master pattern to be replicated in a projection lithography system. Typically the term mask is used when the projection optics have a magnification factor of unity and the pattern on the mask comprises the totality of the information to be transferred onto the wafer. The term reticle is used when the pattern of the reticle comprises a subset of the information to be transferred to the wafer.

SUMMARY OF THE INVENTION

Accordingly it is an object of the invention to provide method and apparatus for maskless, or reticle-free lithography.

The invention basically includes a pulsed or strobed radiation source with illumination optics to produce an illumination beam made up of a sequence of radiation pulses, a programmable array of binary light switches which is illuminated by the pulses of the illumination beam and which is controllably configured to reflect or diffract a desired pattern of radiation from each pulse, and a projection system which projects the desired pattern of radiation onto a substrate. The substrate is mounted on a scanning substrate stage that is in motion during the sequence of pulses but which moves only a small fraction of a minimum feature size during the time of a single pulse.

The present invention obviates many limitations of reticle/mask based lithography, because the master pattern data is no longer resident on a specific carrier such as a piece of glass. Instead it is resident in a computer memory where it can be quickly accessed, and if necessary, easily modified. Multiple, identical copies of the pattern can be readily transferred to multiple lithography systems.

According to the invention, in a typical lithographic application, the master pattern data is transferred to a programmable array of binary light switches located in the object plane of a projection system. A preferred programmable array is the digital micro-mirror device (DMD) by Texas Instruments (TI). The array of mirrors serves as a programmable array of binary light switches, a deflected mirror corresponding to a dark portion of a desired pattern, and an undeflected mirror corresponding to a bright portion of the pattern or vice versa. A high contrast pattern can thus be projected onto a substrate each time the illumination source flashes.

Other programmable array devices based on arrays of mirrors, and also based on gratings and interference effects can also be used. Programmable arrays can be used with a variety of radiation sources, including visible light, ultra-visible light, extreme ultraviolet (EUV), x-rays, electrons and ions. The pulsed or strobed source may be formed of an emitter which operates in a pulsed mode or a continuous emitter with a shutter or other strobe means located anywhere in the optical system to produce a pulsed illumination beam.

Maskless, reticle-free lithography can introduce redundancy into the pattern replication process and thereby obviate the need for defect free programmable arrays. This is done by using multiple flashes or pulses to achieve a full exposure and many array pixels to make up a single minimum feature on the exposed wafer. The maskless lithographic scheme can be very forgiving of an inoperative pixel in the programmable array.

If the number of mirrors in a DMD device is insufficient to convey the information in a typical lithography reticle pattern, a large linear array of DMDs could be made to span the field length of a scanner lens. A continuous band of imagery across the length of the scanner lens can be achieved by staggering the placement of the DMD arrays in the direction of scanning. Appropriate exposure continuity and uniformity at the plane of the substrate can be produced by an appropriate programming sequence for the array.

The pulsed or strobed illumination system must have the appropriate spectral properties to complement the optical projection system. The travel of the wafer during the illumination pulse must be short in comparison to the size of a minimum feature. A number of optical sources can be used with the DMD embodiment, including excimer lasers, and frequency multiplied, diode-pumped, solid state lasers and copper vapor lasers, all of which provide short wavelength illumination, pulsed at kilohertz or multi-kilohertz frequencies, and with pulse durations less than 100 nsec.

DETAILED DESCRIPTION OF THE PREFERRED EMBODIMENTS

In the optical lithography system of the invention, the function of the mask or reticle used in prior art systems is replaced by a programmable array which is illuminated by a pulsed or strobed light source and imaged onto a substrate which is being scanned at constant velocity. All the information to be projected onto the substrate is contained in the programmable array and may be readily changed by computer control of the array elements without changing any of the hardware in the system.

Figure 1:
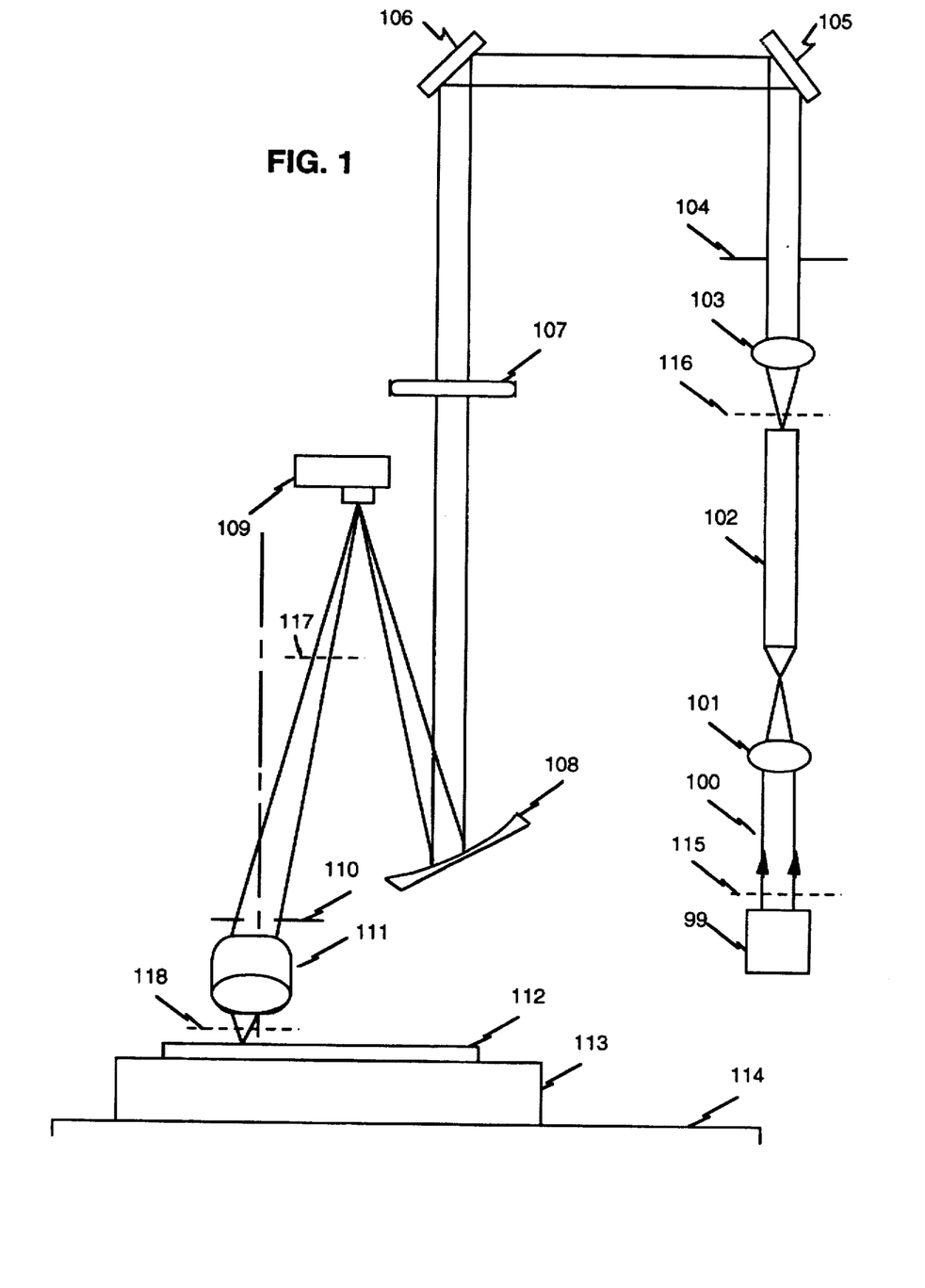
FIG. 1 is a schematic view of the principal components of a maskless optical lithography system.

In FIG. 1 a maskless lithography system has an illumination source 99 which produces, alone or in combination with other components as described herein, a pulsed illumination beam 100. For example beam 100 can be the pulsed output beam from an excimer laser, which typically has a pulse duration of about 30 ns and which can be pulsed at rates that exceed 1000 Hz. This beam enters a relay system represented by relay lens 101 but which is typically an anamorphic system containing cylindrical lenses that create the desired numerical aperture in the beam before it is introduced into a light pipe 102 that will improve the spatial uniformity of the laser beam and define its area when it emerges. A fly's eye lens array could be used to perform the same function as the light pipe 102.

A relay system consisting of two illuminator lenses 103, 107, two fold mirrors 105, 106, and a curved mirror 108, form a magnifying relay that images the output face of the light pipe 102 onto a programmable array 109 and images an illuminator pupil (stop) 104 at the projection lens pupil (stop) 110 when the light is simply reflected from the programmable array 109. The illuminator pupil 104 is located in the magnifying relay system, after lens 103, and the projection lens pupil 110 is located before a projection lens 111, which can be a more complex projection system.

In this configuration the elements of the programmable array which are turned on, act as a simple plane mirror and direct incident illumination into the projection lens pupil 110. Programmable array elements which are turned off steer the incident light away from the projection lens pupil 110. Thus a portion of a pattern stored in a computer memory can be input into the programmable array and imaged with projection lens 111 onto a substrate 112 each time the light beam flashes. The substrate 112 is mounted on a continuously moving stage 113 which is mounted on a platen 114.

An electronic control system coordinates the changing of the image data in the programmable array between flashes or pulses and the triggering of each flash or pulse so that the resultant image has no underexposed gaps or overexposed overlaps. Thus the time between flashes or pulses must exactly correspond to the time taken for a stage motion corresponding to the length of the programmable array in the scan direction or some integral fraction thereof.

The light source need not be a excimer laser. Any pulsed or strobed source of radiation including lasers, flash lamps and light emitting diodes might be used, so long as the radiation is compatible with the binary switching system of the programmable array and the projection optical system. Sources of visible or ultraviolet light which produce an exposing wavelength between 7000 Å and 1200 Å can be used.

Sources of extreme ultraviolet (EUV) or soft x-ray radiation with a wavelength between 50 Å and 200 Å can also be used. The programmable array would then be made of EUV or soft x-ray mirrors. Examples of such mirrors are (a) grazing incidence reflectors of the radiation and (b) multilayer resonant reflectors of the radiation. A grazing incidence reflector may be a reflector element with a coating of high atomic number (Z) material selected from tungsten, gold, rubidium, platinum, titanium or other materials with Z greater than 12. A multilayer resonant reflector may be a reflector element with multilayer coatings of Mo/Si, Mo/Be, W/C, Ru/B$_4$C, or Ru/Si; other suitable combinations are shown in Hawryluk and Ceglio, "Wavelength considerations in soft x-ray projection lithography," Applied Optics, Vol. 32, No. 34, 1 Dec. 1993, pp. 7062–7067.

While the pulsed radiation source may be a source which operates in a pulsed mode, the source may also be a continuous (CW) radiation emitter which is modulated or strobed by any suitable means, e.g. a high frequency shutter. Separate shutter or other strobing means may be placed anywhere in the system, either before or after the array, e.g. at illustrative positions 115–118 in FIG. 1, or the elements of the array itself may act as a shutter. In the maskless lithography system, illumination is provided by any pulsed illumination system with the appropriate spectral properties dictated by the optical projection system. A constraint on the pulsed illumination system is that the wafer motion during the pulse must be short in comparison to the size of a minimum feature. Moving the substrate slowly is not desirable if maximum system throughput is to be achieved, and stopping the stage for each flash would not be time efficient either.

A preferred embodiment of a programmable array is the digital micro-mirror device (DMD) currently manufactured by Texas Instruments (TI) as described in Mignardi, "Digital Micro-Mirror Array for Projection TV," Solid State Technology, July 1994, p. 63. A single such DMD device may hold as many as 2 million mirrors with each mirror being about 16 μm square with a 17 μm center to center spacing. Each mirror can be independently deflected over a ±10 degree range of angular motion with a settling time of a few microseconds. In this way the array of mirrors serves as a programmable array of binary light switches wherein a deflected mirror corresponds to a dark portion of a desired pattern (switch off), and an undeflected mirror corresponds to a bright portion of the pattern (switch on). Using this protocol a high contrast pattern can be projected onto a substrate each time the illumination source flashes.

The DMD is just one example of a programmable array of switches. Other programmable array devices operate with sources of lithographic radiation other than just visible or ultraviolet light. Such other sources of radiation include extreme ultraviolet (EUV), x-rays, and electrons and ions. Programmable arrays may be based on arrays of mirrors, like the TI device, or on gratings or on interference effects to provide switching at each pixel location. With further development, microdevices such as the DMD will have more and smaller pixels and they will be much faster, thus expanding the capabilities of this technique.

A number of optical sources are appropriate for use with the DMD embodiment. One illumination source is the excimer laser which typically flashes for about 30 ns and can be pulsed at rates up to 1000 Hz. With a stage velocity of 25 mm/sec, the distance traveled per flash is only about 6Å. There are other short pulse, high repetition rate lasers which also meet this requirement. Diode pumped solid state lasers and copper vapor lasers both can be frequency multiplied (i.e. wavelength reduced) to provide short wavelength illumination, and both can be operated at multi-kilohertz frequencies with pulse durations less than 100 ns.

The resolution of this system can be increased by utilizing shorter wavelength radiation. Two embodiments of the DMD type array which exploit the short wavelength option are:

1. The DMD mirror array could be coated with multilayered resonant reflectors, as described above, for EUV or soft x-ray radiation. Then the multilayer coated DMD can serve as a programmable array for EUV or soft x-ray projection lithography. Examples of such multilayered coatings are Mo/Si coatings for narrowband radiation around 13.5 nm, and Mo/Be coatings for radiation around 11.5 nm.

2. The DMD mirror array could be used to image light on a photocathode with an appropriate photoemissive material such as CsI, CeTe, SbCs, AgOCs, InGaAs, NaKSbCs, NaKSb, or GaAsP. In this embodiment the illuminated photocathode would become an electron emitter serving as a programmable array for projection electron lithography.

Whether a pixel element is turned on or off will depend on the design of the programmable array and the way it is employed in the optical system. In the case of a mirror array type, it is possible to arrange the optics so that illumination striking a deflected mirror in the array is imaged on the substrate and light striking an undetected mirror in the array is dumped or vice versa.

Typically the programmable array or collection of arrays will not fill the field of the projection system, but will utilize a strip stretching from one side of the field to the other, across the center of the field. It is also possible to employ a ring field type projection system and to arrange the programmable arrays so that they lie within the arcuate shape of the corrected field.

Figure 2:
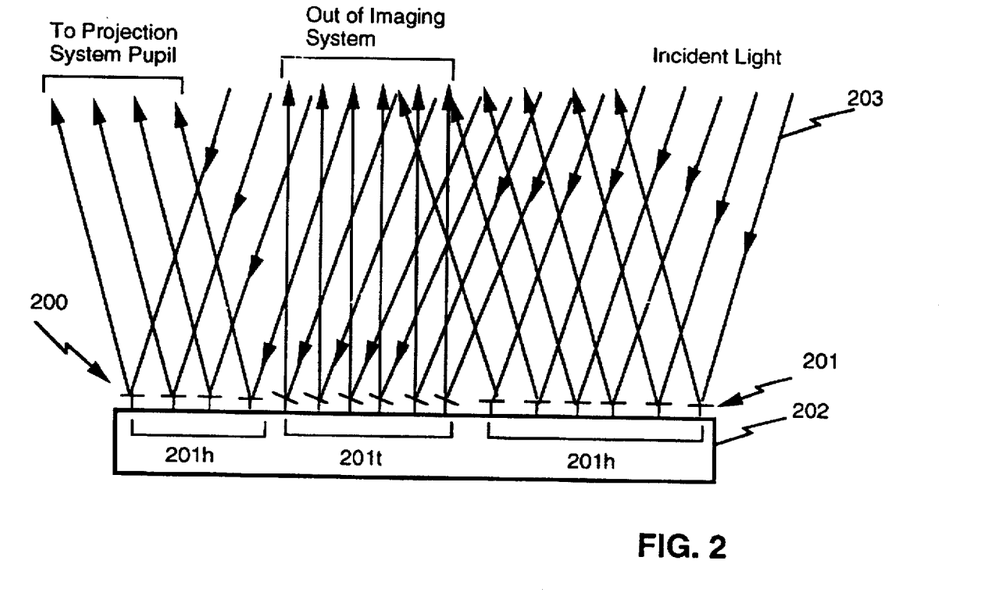
FIG. 2 is a small section through a specific array of a digital micro-mirror device (DMD) showing small groups of mirrors in the on and off positions.

FIG. 2 is a small section through a specific array of the digital micro-mirror device (DMD) showing how a small group of mirrors may be deflected (switched off) to dump the incident energy out of the acceptance angle of the relay lens and how another group of mirrors may be left undetected (switched on) to reflect the incident illumination into the relay lens.

A small section of a programmable array 200, similar in principle to the DMDs produced by TI, is schematically illustrated in FIG. 2. Programmable array 200 consists of individual addressable mirror elements 201 arranged in an array on a substrate 202. A portion of a pattern is contained in the array so that some of the elements are turned on (the horizontal mirror elements 201h) and some are turned off (the tilted mirror elements 201t). The "on" elements 201h reflect the incident illumination just as a plane mirror would. When used in the configuration shown in FIG. 1 this light would be directed into the pupil 110 of the projection system and would form the bright portion of the image. The light striking the tilted DMD array "off" elements 201t is reflected out of the pupil 110 of the projection system and would therefore comprise the dark portion of the image.

In currently available DMD devices made by Texas Instruments, the number of mirrors is sufficient to produce a high quality TV picture but insufficient to convey more than a tiny portion of the information in a typical lithography reticle pattern. However, a large linear array of DMDs could be made to span the field length of a scanner lens. A continuous band of imagery across the length of the scanner lens can be achieved without the necessity of butting the individual DMD arrays by staggering the placement of the DMD arrays in the direction of scanning. Appropriate exposure continuity and uniformity at the plane of the substrate may be accomplished by an appropriate programming sequence for the programmable array. In essence continuity and uniformity of illumination at the substrate is reduced to a matter of bookkeeping and data management.

The optimum magnification between the mirror array and the substrate will depend on the application, and on the type of programmable array used in the application. For a flat panel application, where the minimum feature size is typically of order 3 µm, a currently available Texas Instruments DMD, which has a 17 µm spacing between mirror elements, requires a magnification from the substrate to the array to be of order 17, so that each mirror in the programmable array is equivalent to about 1 µm on the image plane and approximately 9 mirrors are required to form a minimum feature of 3 µm by 3 µm. In an integrated circuit application, where minimum features of 0.5 µm are required, using the same DMD device, the required magnification from the image to the array plane might be of order 3×17/0.5=102.

The number of programmable arrays required to span the field of a lithography system will depend on the application and the desired performance. For example if a 50 mm wide image field is desired for the flat panel application, and each DMD type array is 2000 mirror elements wide, then 25 DMDs are required to span the field. In the integrated circuit application requiring 0.5 µm minimum feature size, about 66 DMDs are required to span a 22 mm field.

A collection of programmable arrays can be constructed so that a continuous band of imagery is produced that spans the length of the field of the relay lens. The need to butt the arrays together to form a continuous band of imagery is avoided by staggering the placement of the individual arrays in the direction of scanning. The data handling system takes into account the discontinuities in the scanning direction so that a continuous image is produced on the substrate when the system is scanned.

Figure 3:
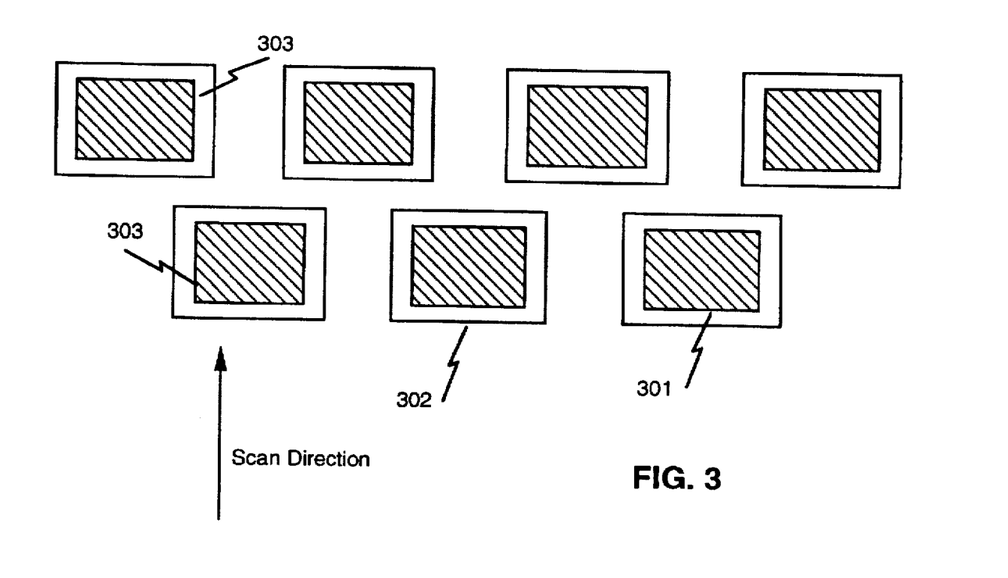
FIG. 3 shows a collection of programmable arrays constructed so that a continuous band of imagery is produced that spans the length of the field of the relay lens.

In FIG. 3 a continuous band of DMDs is produced by staggering the position of individual DMD packages 302 so that the edges 303 of the active element arrays 301 in the packages line up in the scan direction. The differences in scan position can be accommodated by the data handling system which simply delays inputting image data to DMDs which are scanned later than the others.

Figure 4:
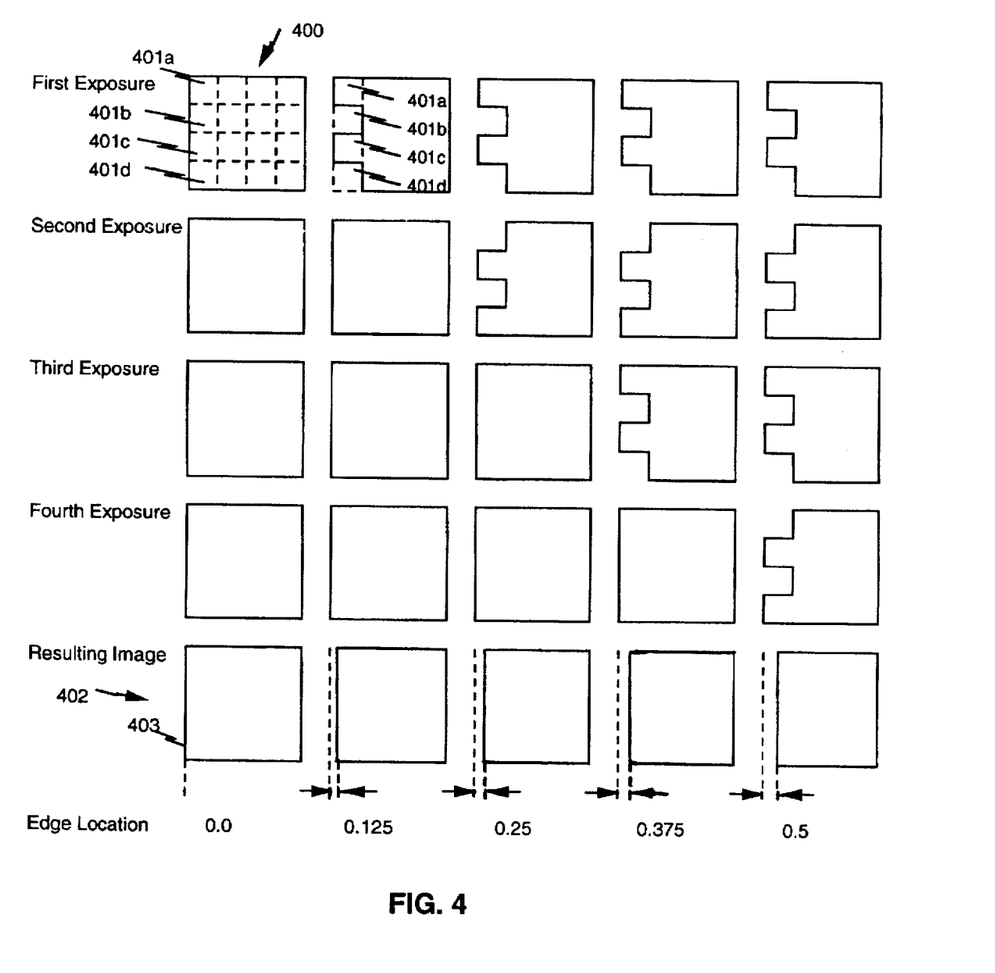
FIG. 4 shows a succession of four programmable array images employed to place the resultant edge of the image on the substrate with an accuracy that is a small fraction of an array pixel.

Multiple exposures can be used to control line edge position, as shown in FIG. 4, by averaging the exposures. The five columns illustrate five different examples of edge placement by averaging four exposures. The first four rows of each column illustrate the four exposures and the fifth row shows the resulting image produced on the resist. Thus, FIG. 4 shows a succession of 4 programmable array images, i.e. the light pattern projected by the array onto the resist. Each image corresponds to a different flash of the light source; the four images are averaged together by the resist to place the resultant edge of the image on the substrate with an accuracy that is a small fraction of an array pixel.

For example, assuming 4 array pixels per linear minimum resolved feature element on the substrate, then a single exposure can locate a line edge along any edge corresponding to a pixel or half way between two pixel edges by alternating on and off with every pixel along the desired edge. Since the pixels are below the resolution of the projection system, the rough edge produced by turning on every other pixel is smoothed and averaged by the projection system to a clean edge on the substrate half way between the boundaries of the alternating pixels.

An array 400, shown in FIG. 4, is made up of 4×4=16 pixels 401a, b, c, d, etc. Assuming that 4 pixels are required per linear minimum resolved feature element, the location of edge 403 of image 402 is shown as a function of the four pixels 401a, b, c, d. In the first column, all four exposures have all 16 pixels turned on. Thus the resulting image 402 has edges determined by the full exposure, i.e. edge 403 is located at 0.0.

In the second column, during the first exposure, pixels 401a, c are on but 401b, d are off; if one exposure were sufficient, then this would move edge 403 over a distance corresponding to ½ of a pixel width. However, four exposures are necessary to define the edge. The second, third and fourth exposures are all full exposures, i.e. all pixels on. When the first and second exposures are averaged, the position would be shifted by ¼ of a pixel width; when the third and fourth exposures are also averaged, the final edge position is moved by ⅛ of a pixel width from the 0.0 position.

Similarly, in the third column, during the first two exposures half of pixels 401a, b, c, d are on and half are off, and the third and fourth exposures are full exposures so the position of edge 403 is moved by ¼ of a pixel width. In the fourth column, during the first three exposures half of pixels 401a, b, c, d are on and half are off, and the fourth exposure is full, so the position of edge 403 is moved by ⅜ of a pixel width. In the fifth column, during all four exposures half of pixels 401a, b, c, d are on and half are off, so the position of edge 403 is moved by ½ of a pixel width.

If a single exposure can define an edge of a pattern to ½ of a pixel width, then 2 exposures, taking advantage of the averaging that occurs, can locate an edge to ¼ of a pixel width, 4 exposures can locate an edge to ⅛ of a pixel width, and 8 exposures can locate an edge to 1/16 of a pixel width. Thus the location of any edge in a pattern can be controlled to a particular fraction of a minimum feature size, depending on the ratio between the minimum feature size and the size of an individual array element.

The number of flashes (pulses) desired on each portion of the pattern will also depend on the application. On an application where good line width control is not required, a single flash might be sufficient. In this case the illumination uniformity will depend on the flash-to-flash energy variation and the minimum increment in line width will be about half the dimension spanned by a single array pixel.

In an application requiring very tight edge control, it might be desirable to employ as many as 8 flashes on each portion of the pattern. By adjusting the number of "on" array elements used to represent a feature edge between flashes, it should be possible to adjust the location of any edge to 1/16 of an array pixel or 1/48 of a minimum feature size, assuming a 3:1 ratio between the minimum feature size and the size of an individual array element. This corresponds to a line width control of about ±2% of the minimum feature size.

The above examples show a clear trade-off between line width control and throughput. In applications where good line width is not critical, the programmable array can be configured to expose a given geometry with only a few flashes, thereby providing a very high throughput. For line width critical applications, many exposures can be used to locate each feature edge with great precision, but the throughput will be correspondingly lower, assuming that the throughput is limited by the rate at which the array can be cycled from one picture to the next. In applications where high throughput and very accurate edge placement are both desired, then both can be achieved by doubling or tripling the number of rows of programmable arrays. This is equivalent to using an array with a larger number of elements in the direction of scan.

Figure 5:
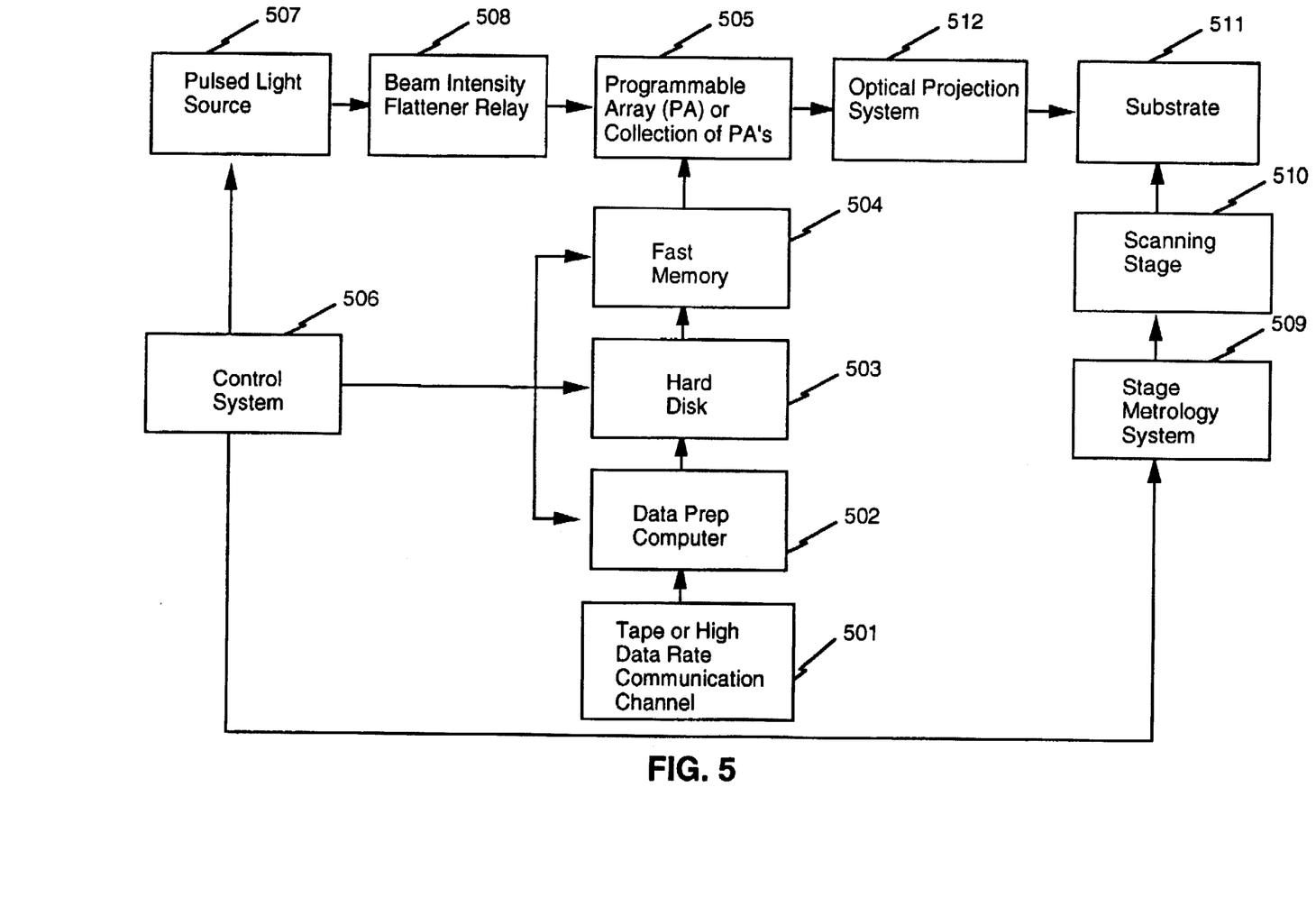
FIG. 5 shows the major subsystem components for a maskless optical lithography system, including control and data path details.

The major subsystems in a maskless lithography system are shown in FIG. 5. Raw data describing the mask pattern is input to the system via a magnetic tape or high speed communication channel 501. This data is normally compressed and would have to be expanded into a digital image by a data preparation computer 502 and stored on a hard disk 503 or other rapid access medium having a high data volume capability. Just before it is needed the data would be transferred into a high speed memory 504 such as a DRAM so it can be quickly transferred into the programmable array 505 between flashes. A computer control system 506 connected to computer 502, hard disk 503, and fast memory 504 would orchestrate the data transfer process and synchronize the flashing of the pulsed light source 507 with the position of the scanning substrate stage 510. Light from source 507 passes through a beam intensity flattener and relay 508 to the programmable array 505. Control system 506 is connected to stage metrology system 509 which drives scanning stage 510 which moves substrate 511. Light beams reflected from programmable array 505 pass through optical projection system 512 onto substrate 511.

Figure 6:
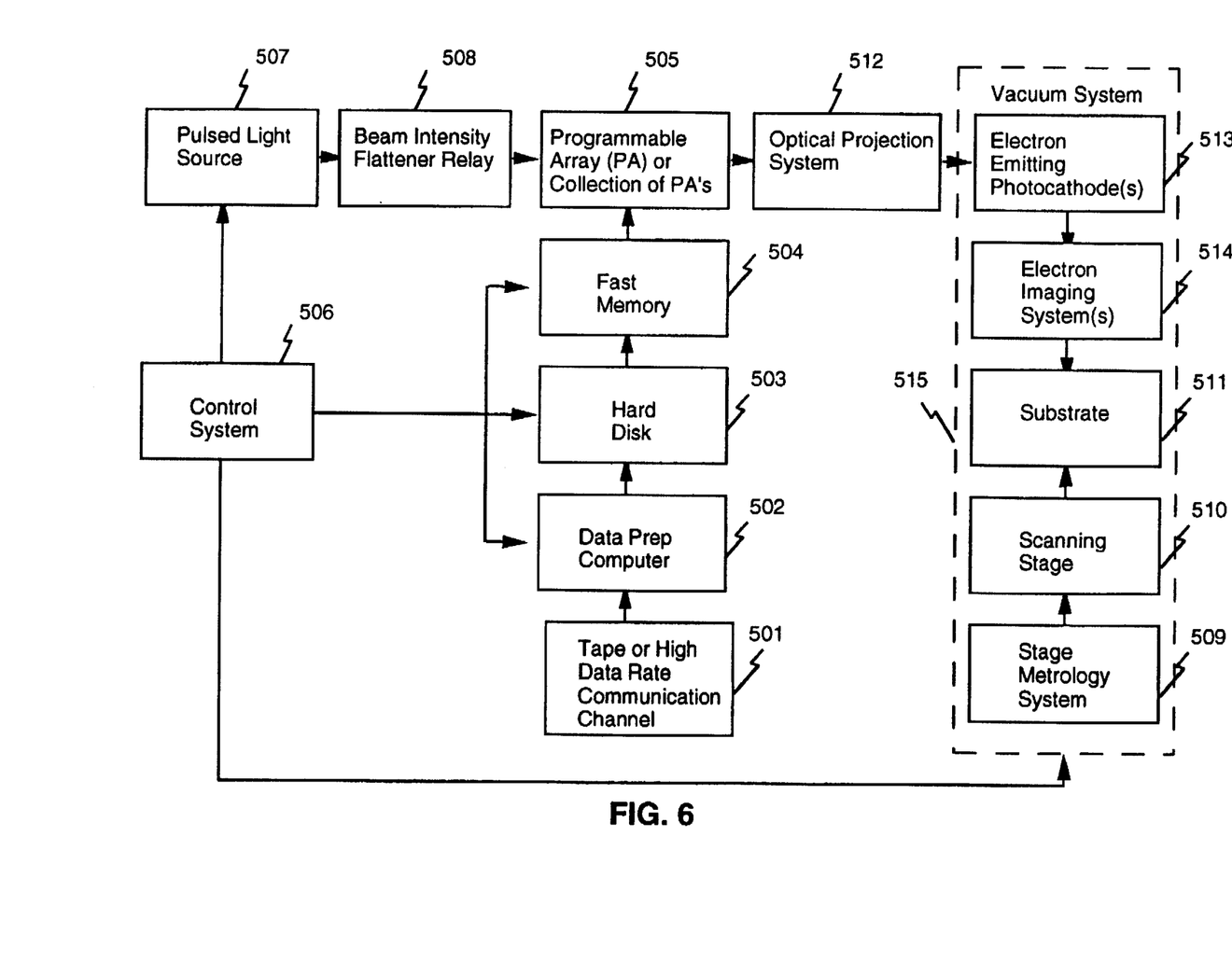
FIG. 6 shows the major subsystem components for a maskless electron beam lithography system.

By adding a few extra subsystems it is possible to create a maskless e-beam lithography system as shown in FIG. 6. This contains all the subsystems described in FIG. 5 plus an electron emitting photocathode 513 and an electron imaging system (lens) 514. The light pattern projected by optical projection system 512 is incident onto electron emitting photocathode 513 to produce an electron image which is imaged onto the substrate 511 by electron imaging system 514. The photocathode surface, the electron lens, the substrate, the scanning stage and the stage metrology system must all be contained in a high vacuum system 515.

By using electrons rather than photons to create the final image it is possible to achieve higher resolution. For example an optical image with 1.0 μm minimum feature size could be transformed into an electron image with 0.1 μm minimum feature size with a 10:1 electron reduction lens. Unlike serial-write e-beam systems, this maskless system would write several million pixels in parallel and therefore would have a very high throughput.

Figure 7:
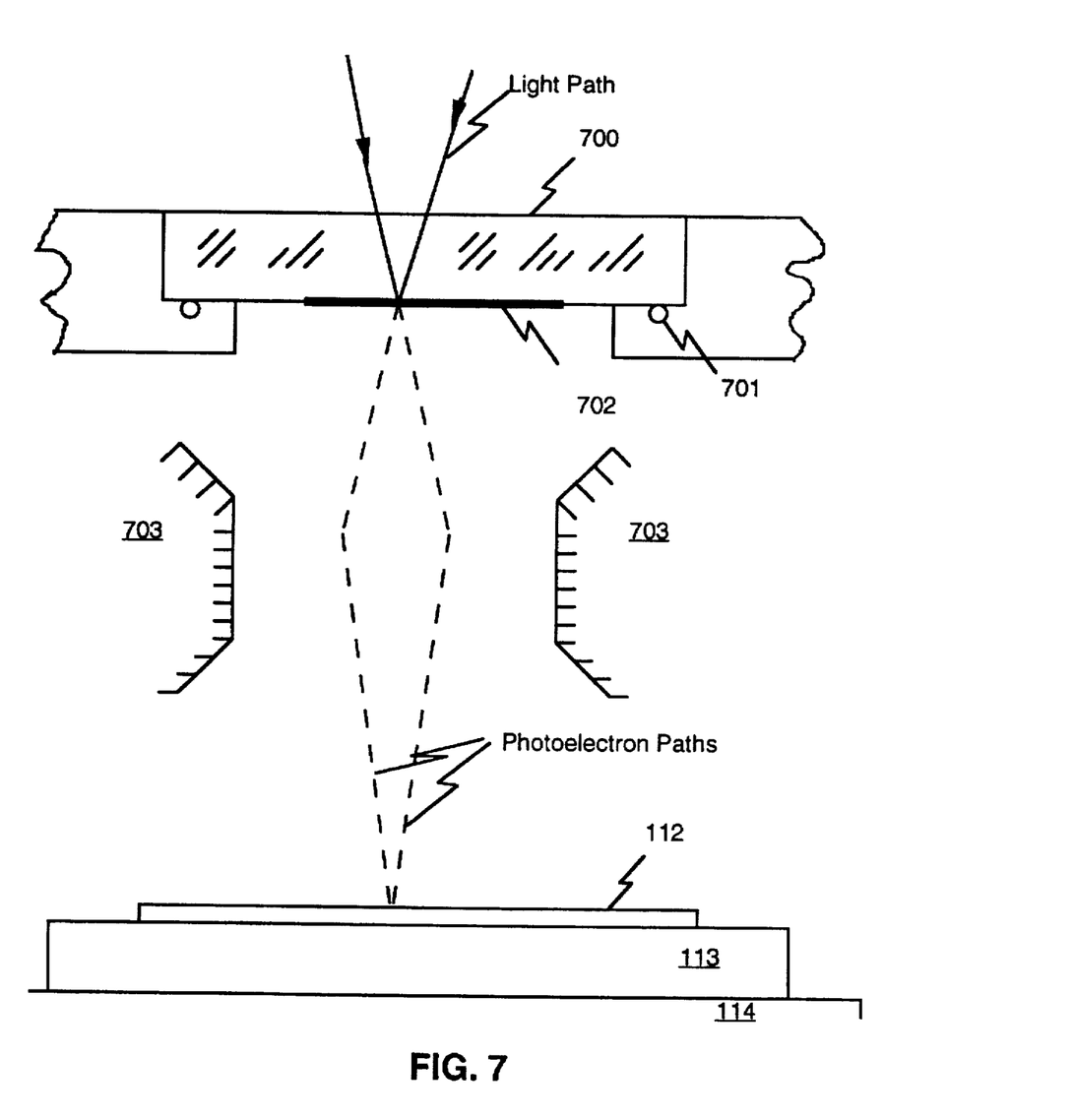
FIG. 7 shows some of the major components in the electron imaging part of a maskless electron beam lithography system.

In an electron imaging system for maskless lithography, shown in FIG. 7, the projected optical image of the programmable array passes through a window 700 which isolates the high vacuum e-beam part of the system from the pressurized path of the optical train with a vacuum seal 701. The optical image is brought to focus on the bottom side of the window 700 which is coated with materials which act as a photocathode 702. The photocathode is formed of a negative electron affinity material or electron photoemissive material; e.g., p+ doped gallium arsenide (GaAs) with a cesiated coating (Cs—0) is used for the photocathode. Thus every few photons incident on the photocathode result in the emission of a photoelectron which is accelerated by a nearby electron lens 703 and brought to focus on the top surface of the substrate 112 which is moved by scanning stage 113 which is mounted on a vacuum platen 114.

A useful feature of these systems is that the reticle is eliminated and thereby a significant source of line width error, overlay error and defect errors is also eliminated. The programmable array determines the line width and edge placement to a tiny fraction of a minimum feature size everywhere in the field and this will be identical from one lithography system to another. Errors such as projection lens distortion, wafer scale changes, including anisotropic scale changes, or placement errors in the position of one array relative to another array in the focal plane can be measured and removed from the system by putting equal and opposite errors into the image data so that the errors cancel out. Another useful feature is that the effect of defects such as inoperable array elements is minimized by using multiple array elements for each minimum feature size in the image. The effect of a defective element is further reduced by voting if multiple flashes are used to expose each pattern element. Alignment between the pattern in the array and the previously printed patterns on the wafer is also facilitated because the pattern data in the programmable array can be moved faster than the scanning stage.

The control system can vary the position of the image edges on the substrate between pulses so as to achieve precise control of the position of each edge which is a small fraction (<0.5) of the projected size of a single programmable array pixel. The control system can electronically adjust the scale and distortion of the image in the programmable array so as to compensate for distortion inherent in the projection system and distortion caused by process induced or other changes in the scale and overall geometrical fidelity of the previous patterns printed on the substrate. The control system can electronically introduce image distortions that are equal in magnitude and opposite in sign to the distortions caused by imperfections in the positioning of the programmable array elements with respect to each other so that the resulting image contains no geometrical imperfections. The programmable array can be programmed to scan and align the position of the image in the programmable array so that it is optimally positioned and oriented with respect to previously printed patterns on the substrate.

Maskless, reticle-free lithography can be employed to introduce redundancy into the pattern replication process in order to obviate the need for defect free programmable arrays. In the lithographic replication process, a pulsed illumination source is used so that each time the light source flashes, the pattern on the programmed array is imaged onto the substrate via the projection system, and multiple flashes (for example N flashes) are required to achieve a full exposure. An N-fold redundancy could be achieved by having a programmable array that is at least N elements wide and scanning the substrate at a rate corresponding to one element per flash, while advancing the programmed pattern at an equivalent rate.

The redundancy can be further increased by arranging that the array element or pixel size, after being imaged on the wafer by the lithographic imaging system, corresponds to a small fraction of a minimum feature on the wafer. For example, in a typical arrangement, a single minimum feature on the wafer may be three programmable array pixels wide. Then there would be nine pixels per minimum feature area. This coupled with the N flashes per pixel scheme would provide for a 9N redundancy in the pattern replication process. This would make the maskless lithographic scheme very forgiving of an inoperative pixel in the programmable array.

The maskless, reticle free lithography systems of the invention may be utilized in step and scan machines for the fabrication of micro-devices such as magnetic heads used in disk drives and magnetic tape storage systems, or micro-electronic devices such as memory devices, microprocessors, microcontrollers and specialized ASIC devices, or micro-electromechanical devices such as accelerometers, or flat panel display structures such as active matrix liquid crystal displays.

Changes and modifications in the specifically described embodiments can be carried out without departing from the scope of the invention which is intended to be limited only by the scope of the appended claims.

The invention claimed is:

1. A maskless lithography system comprising;

a programmable array of binary light switches (PABLS), said programmable array comprising active elements that can be digitally programmed to direct, or not direct, incident light into a fixed pupil location, a pulsed or strobed radiation source that illuminates the programmable array with a sequence of pulses, a projection system that images the array pattern onto a substrate, and a scanning substrate stage that is in motion during the sequence of pulses but which moves only a small fraction of a minimum feature size during the time duration of a single pulse.

2. The lithography system of claim 1 wherein the PABLS comprises a digital micro-mirror device.

3. The lithography system of claim 1 further comprising a staggered collection of programmable arrays arranged so that the edges of the active element arrays are aligned with each other and with the direction of scanning.

4. The lithography system of claim 1 wherein said pulsed radiation source comprises a pulsed laser or photodiode array as a source of visible or ultraviolet radiation with an exposing wavelength between 7000 Å and 1200 Å.

5. The lithography system of claim 4 wherein the pulsed laser is an excimer laser, a copper vapor laser or a diode pumped solid state laser.

6. The lithography system of claim 1 wherein said pulsed radiation source comprises a continuous radiation emitter which is modulated by a high frequency shutter.

7. The lithography system of claim 1 wherein said pulsed radiation source comprises a pulsed source of extreme ultraviolet (EUV) or soft x-ray radiation with a wavelength between 50 Å and 200 Å.

8. The lithography system of claim 7 wherein the programmable array comprises EUV or soft x-ray mirrors.

9. The lithography system of claim 1 wherein the pulsed radiation source is a light source and the projection system includes a projection lens with a pupil, and further comprising an illumination system containing a relay lens to bring the light from the source into a light pipe or fly's eye lens array, a number of imaging lenses and/or mirrors to image light exiting the light pipe or fly's eye lens array in a uniform distribution onto the programmable array, and an illumination pupil which is imaged onto the pupil of the projection lens.

10. The lithography system of claim 1 further comprising an electronic control system that coordinates the transfer of digital image data from a memory to the programmable array between radiation pulses and the triggering of the radiation source when the substrate on the scanning stage is correctly positioned to receive the image stored in the programmable array.

11. The lithography system of claim 10 wherein said control system exposes each geometry on the substrate with multiple pulses.

12. The lithography system of claim 11 wherein said control system varies the position of the image edges on the substrate between pulses so as to achieve precise control of the position of each edge to within a small fraction (<0.5) of the projected size of a single programmable array pixel.

13. The lithography system of claim 10 wherein said control system electronically adjusts the scale and distortion of the image in the programmable array so as to compensate for distortion inherent in the projection system and/or distortion caused by process induced or other changes in the scale and overall geometrical fidelity of the previous patterns printed on the substrate.

14. The lithography system of claim 10 wherein said control system electronically introduces image distortions that are equal in magnitude and opposite in sign to the distortions caused by imperfections in the positioning of the programmable array elements with respect to each other so that the resulting, image contains no geometrical imperfections.

15. The lithography system of claim 1 wherein said programmable array is programmed to scan and align the position of the image in the programmable array so that it is optimally positioned and oriented with respect to previously printed patterns on the substrate.

16. The lithography system of claim 1 further comprising;
   a photocathode that receives the projected image of the programmable array and generates photoelectrons, and
   an electron lens which images the photoelectrons onto the substrate.

17. The lithography system of claim 16 wherein the photocathode comprises a negative electron affinity material or electron photoemissive material.

18. A method for maskless lithography comprising;
   programming a programmable array of binary light switches (PABLS) to reflect a desired array pattern, said programmable array comprising active elements that can be digitally programmed to direct, or not direct, incident light into a fixed pupil location,
   illuminating the programmable array with a sequence of radiation pulses,
   imaging the array pattern onto a substrate, and
   moving the substrate during the sequence of pulses but only a small fraction of a minimum feature size during the time of a single pulse.

19. The method of claim 18 further comprising forming the programmable array of active elements that can be digitally programmed to direct, or not to direct, incident light into a fixed pupil location.

20. The method of claim 18 wherein the step of imaging the array pattern onto the substrate further comprises:
   receiving the array pattern image on a photocathode to generate photoelectrons, and
   imaging the photoelectrons onto the substrate.

* * * * *